United States Patent
Tsai et al.

(10) Patent No.: US 10,762,951 B1
(45) Date of Patent: Sep. 1, 2020

(54) STATIC RANDOM ACCESS MEMORY DEVICE WITH KEEPER CIRCUIT

(71) Applicant: UNITED MICROELECTRONICS CORP., Hsin-Chu (TW)

(72) Inventors: Chih-Wei Tsai, Hsinchu (TW); Tsan-Tang Chen, Miaoli County (TW); Chung-Cheng Tsai, Taichung (TW); Yen-Hsueh Huang, Taipei (TW); Chang-Ting Lo, New Taipei (TW); Chun-Yen Tseng, Tainan (TW); Yu-Tse Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/455,783

(22) Filed: Jun. 28, 2019

(30) Foreign Application Priority Data

May 31, 2019 (TW) .............................. 108118858 A (51) Int. Cl.
  *G11C 11/412* (2006.01)
  *G11C 11/419* (2006.01)
  *G11C 11/418* (2006.01)

(52) U.S. Cl.
  CPC .......... *G11C 11/412* (2013.01); *G11C 11/418* (2013.01); *G11C 11/419* (2013.01)

(58) Field of Classification Search
  CPC ... G11C 11/412; G11C 11/419; G11C 11/418; G11C 7/12; G11C 11/413
  See application file for complete search history.

(56) References Cited

U.S. PATENT DOCUMENTS

| | | | |
|---|---|---|---|
| 5,781,469 A | 7/1998 | Pathak | |
| 9,111,638 B2 | 8/2015 | Burnett | |
| 9,129,706 B2 | 9/2015 | Shankar | |
| 2015/0200006 A1* | 7/2015 | Wang | G11C 11/419 365/156 |
| 2016/0012881 A1* | 1/2016 | Kuo | G11C 5/148 365/156 |

* cited by examiner

*Primary Examiner* — David Lam
(74) *Attorney, Agent, or Firm* — Winston Hsu (57) ABSTRACT

An SRAM device includes a memory cell and a keeper circuit. The memory cell is formed in an active area and coupled to a first bit line and a second bit line. The keeper circuit is formed in the active area and configured to charge the second bit line when the first bit line is at a first voltage level and the second bit line is at a second voltage level or charge the first bit line when the second bit line is at the first voltage level and the first bit line is at the second voltage level, wherein the second voltage level is higher than the first voltage level.

12 Claims, 6 Drawing Sheets

STATIC RANDOM ACCESS MEMORY DEVICE WITH KEEPER CIRCUIT

CROSS REFERENCE TO RELATED APPLICATION

This application claims priority of Taiwan Application No. 108118858 filed on 2019 May 31.

BACKGROUND OF THE INVENTION

1. Field of the Invention

The present invention is related to an SRAM device, and more particularly, to an SRAM device having keeper circuit.

2. Description of the Prior Art

Memory is used in almost all electronic devices as storage media. There are many types of memories, including dynamic random access memory (DRAM), static random access memory (SRAM) and flash memory. SRAM is a volatile memory cell capable of retaining data when powered. Unlike DRAM which must be periodically refreshed, SRAM is faster and typically used for cache memory in computer systems.

Figure 1:
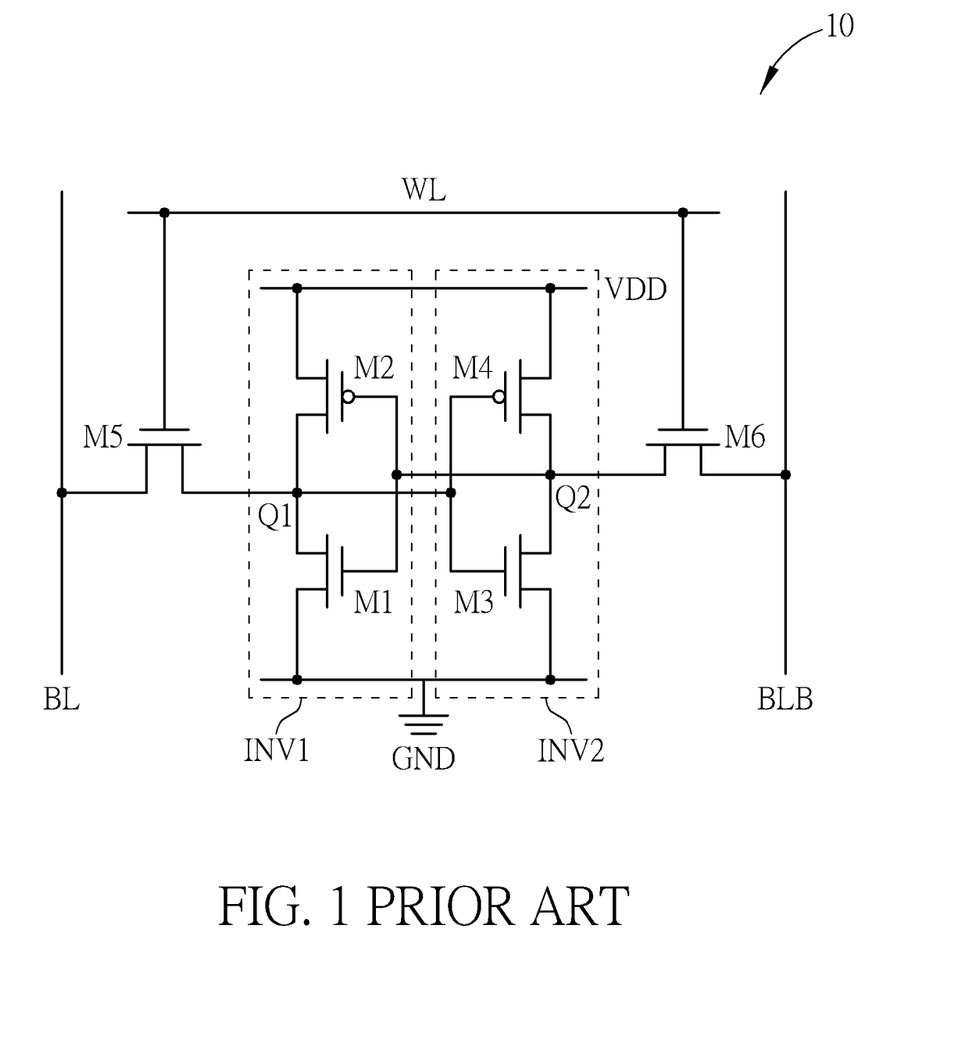
FIG. 1 is a diagram illustrating a prior art 6T-SRAM memory cell.

FIG. 1 is a diagram illustrating a prior art six-transistor SRAM (6T-SRAM) memory cell 10. The 6T-SRAM memory cell 10 includes a flip-flop formed by pull-down transistors M1 and M3, pull-up transistors M2 and M4, and access transistors M5 and M6.

The pull-up transistor M2 and the pull-down transistor M1 form an inverter INV1 having both ends respectively coupled to a bias voltage VDD and a ground voltage GND. Similarly, the pull-up transistor M4 and the pull-down transistor M3 form an inverter INV2 having both ends respectively coupled to the bias voltage VDD and the ground voltage GND. The inverters INV1 and INV2 form a latch circuit which latches data in a storage node Q1 or Q2. More specifically, the storage node Q1 is coupled to the control ends of the pull-down transistor M3 and the pull-up transistor M4, as well as coupled to the first ends of the pull-down transistor M1, the pull-up transistor M2, and the access transistor M5. Similarly, the storage node Q2 is coupled to the control ends of the pull-down transistor M1 and the pull-up transistor M2, as well as coupled to the first ends of the pull-down transistor M3, the pull-up transistor M4, and the access transistor M6. The control ends of the access transistors M5 and M6 are coupled to a word line WL, and the second ends of the access transistors M5 and M6 are respectively coupled to corresponding bit lines BL and BLB.

An embedded SRAM (eSRAM) includes a logic circuit and a memory array coupled to the logic circuit. The memory array may include a plurality of 6T-SRAM memory cells 10 depicted in FIG. 1, and the logic circuit may include a word line decoder, a bit line decoder, a sense amplifier, an input/output unit, and a timing control circuit. In order to write data into or read data from each 6T-SRAM memory cell 10, a corresponding word line needs to be enabled by turning on its access transistors M5 and M6. In the write operation, an external bias voltage is used to change the contents of the storage nodes via corresponding bit lines BL and BLB. In the read operation, the corresponding bit lines BL and BLB are pre-charged to a specific level before allowing the contents of the storage nodes Q1 and Q2 to influence the levels of the corresponding bit lines BL and BLB. The sense amplifier may then enlarge the difference between the levels of the corresponding bit lines BL and BLB for data readout. For the same column of 6T-SRAM memory cells 10 coupled to the same pair of bit lines BL and BLB, it is assumed that a logic 1 data is stored in the first 6T-SRAM memory cell 10 controlled by a first word line $WL_1$ (with the storage node Q1 at logic 0 and the storage node Q2 at logic 1) and a logic 0 data is stored in the second 6T-SRAM memory cell 10 controlled a second word line $WL_2$ (with the storage node Q1 at logic 1 and the storage node Q2 at logic 0), wherein the first word line $WL_1$ is adjacent to the second word line $WL_2$. When reading data from the first 6T-SRAM memory cell 10, its access transistors M5 and M6 are turned on by the first word line $WL_1$ at logic 1 level. Under such circumstance, the bit line BLB is pulled to logic 1 by the storage node Q2, and the bit line BL is pulled to logic 0 by the storage node Q1. Although the access transistors M5 and M6 in the second 6T-SRAM memory cell 10 are turned off by the second word line $WL_2$ at logic 0 level, the logic 0 level of the storage node Q2 in the second 6T-SRAM memory cell 10 may pull down the level of the bit line BLB due to leakage current of its access transistors M5 and M6. Therefore, when reading data from the first 6T-SRAM memory cell 10, the sense amplifier may not be able to read the correct logic 1 data if the difference between the levels of the bit lines BL and BLB is reduced by the leakage current caused by the second 6T-SRAM memory cell 10.

In order to compensate the above-mentioned leakage current, a keeper circuit is typically disposed inside the peripheral logic circuit of a prior art SRAM device so as to charge specific word lines for compensating the voltage drop due to the leakage current. However, such structure requires a larger circuit area overhead, which increases design cost and complicity.

SUMMARY OF THE INVENTION

The present invention provides an SRAM device which includes a memory cell and a keeper circuit. The memory cell is formed in an active area and coupled to a first bit line and a second bit line. The keeper circuit is formed in the active area on a first side of the memory cell and configured to charge the second bit line when the first bit line is at a first voltage level and the second bit line is at a second voltage level higher than the first voltage level.

The present invention also provides an SRAM device which includes a plurality of bit line groups, a word line, a plurality of memory cells, a keeper circuit and a strapping cell. Each of the plurality of bit line groups includes a first bit line and a second bit line disposed in parallel. The word line is perpendicular to the first bit line and the second bit line of each bit line group. Each of the plurality of memory cells is coupled to a corresponding bit line group among the plurality of bit line groups, and coupled to the word line. The keeper circuit and the strapping cell are disposed between the plurality of memory cells and a logic circuit, and coupled to the first bit line and the second bit line of each bit line group.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
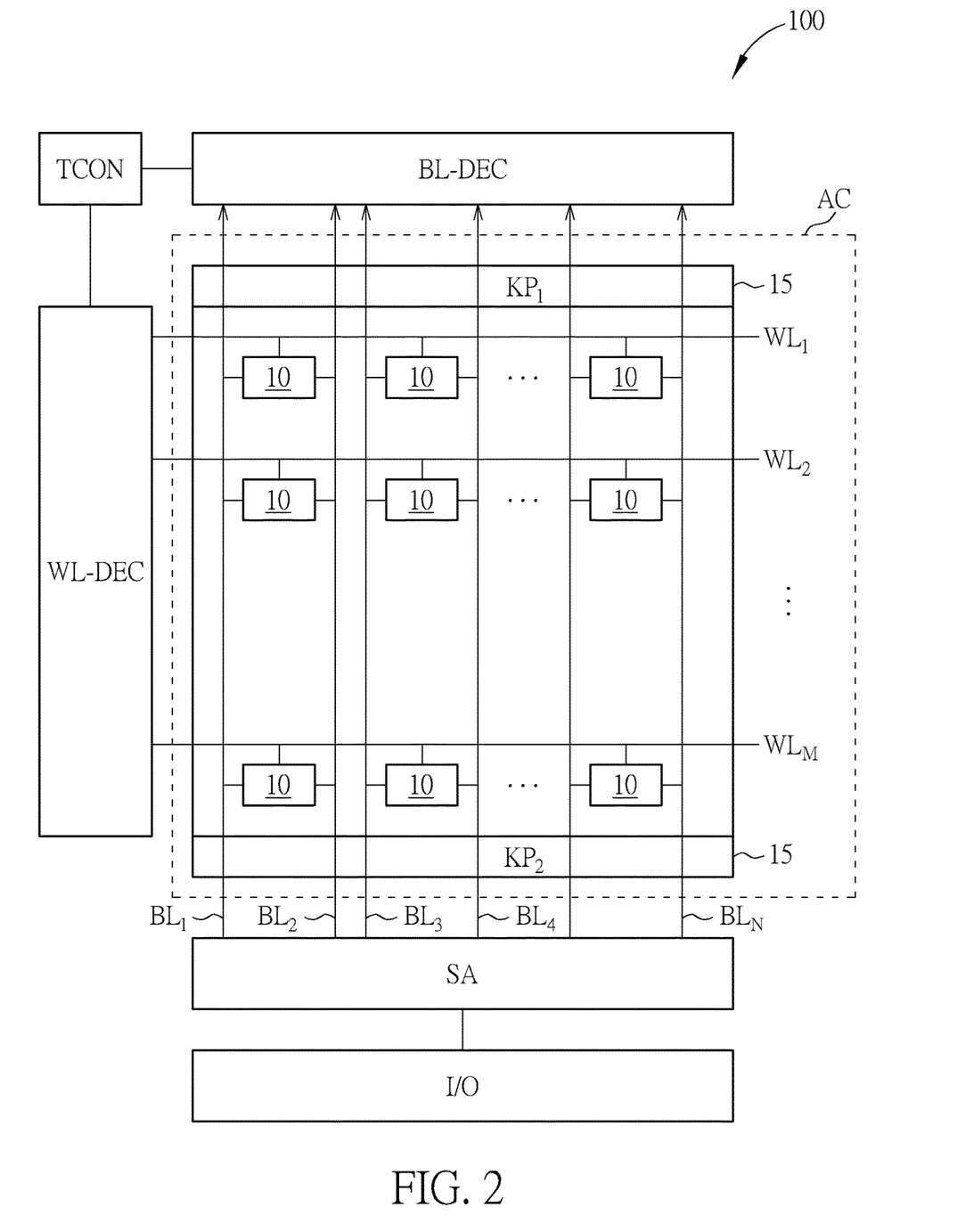
FIG. 2 is a diagram illustrating an SRAM device according to an embodiment of the present invention.

FIG. 2 is a diagram illustrating an SRAM device 100 according to an embodiment of the present invention. The SRAM device 100 includes an active area AC and a peripheral area which surrounds the active area AC. A plurality of bit lines $BL_1$~$BL_N$, a plurality of word lines $WL_1$~$WL_M$, a plurality of memory cells 10, a plurality of strapping cells 15, and two keeper circuits $KP_1$ and $KP_2$ are disposed in the active area AC, wherein M and N are positive integers. Each memory cell 10 is coupled to two corresponding adjacent bit lines among the plurality of bit lines $BL_1$~$BL_N$ and a corresponding word line among the plurality of word lines $WL_1$~$WL_M$. The strapping cells 15 and the keeper circuit $KP_1$ may be disposed in a region between the first word line $WL_1$ and the boundary of the active area AC, while the strapping cells 15 and the keeper circuit $KP_2$ may be disposed in a region between the $M^{th}$ word line $WL_M$ and the boundary of the active area AC. A word line decoding circuit WL_DEC, a bit line decoding circuit BL_DEC, a sense amplifier SA, an input/output unit I/O, and a timing controller TCON are disposed in the peripheral area. Noteworthily, the SRAM device 100 according to the present invention may further include other logic circuits for its operation. The embodiment depicted in FIG. 2 is only for illustrative purpose, but does not limit the scope of the present invention.

Figure 3:
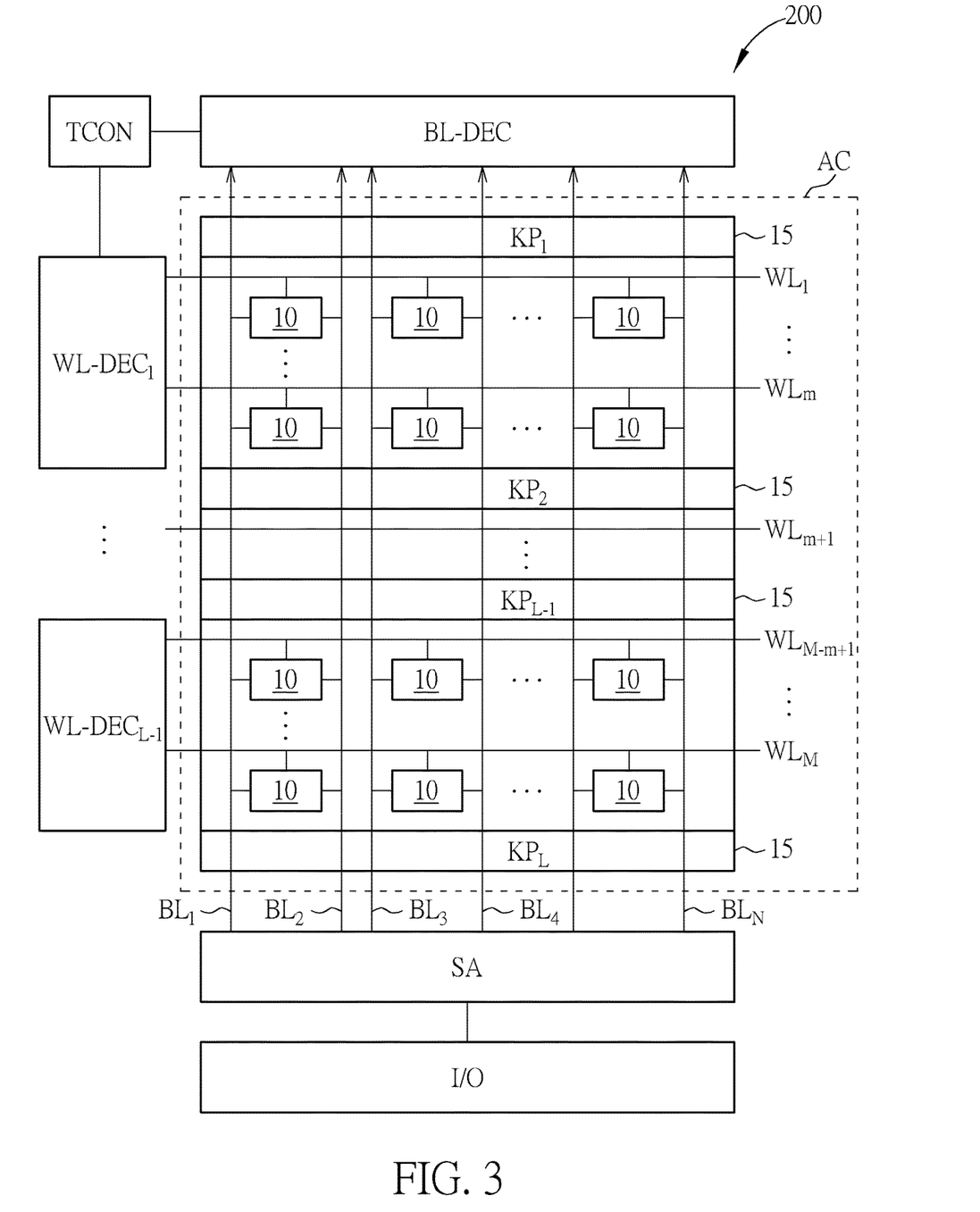
FIG. 3 is a diagram illustrating an SRAM device according to another embodiment of the present invention.

FIG. 3 is a diagram illustrating an SRAM device 200 according to another embodiment of the present invention. The SRAM device 200 includes an active area AC and a peripheral area which surrounds the active area AC. A plurality of bit lines $BL_1$~$BL_N$, a plurality of word lines $WL_1$~$WL_M$, a plurality of memory cells 10, a plurality of strapping cells 15, and a plurality of keeper circuits $KP_1$~$KP_L$ are disposed in the active area AC, wherein M and N are positive integers and L is an integer larger than 2. Each memory cell 10 is coupled to two corresponding adjacent bit lines among the plurality of bit lines $BL_1$~$BL_N$ and a corresponding word line among the plurality of word lines $WL_1$~$WL_M$. The strapping cells 15 and the keeper circuit $KP_1$ may be disposed in a region between the first word line $WL_1$ and the boundary of the active area AC, while the strapping cells 15 and the keeper circuit $KP_L$ may be disposed in a region between the $M^{th}$ word line $WL_M$ and the boundary of the active area AC. There are gap regions between every m adjacent word lines among the plurality of word lines $WL_1$~$WL_M$, wherein the strapping cells 15 and each of the keeper circuit $KP_2$~$KP_{L-1}$ may be disposed in a corresponding gap region. Word line decoding circuits WL_DEC$_1$~WL_DEC$_{L-1}$, a bit line decoding circuit BL_DEC, a sense amplifier SA, an input/output unit I/O, and a timing controller TCON are disposed in the peripheral area. Noteworthily, the SRAM device 200 according to the present invention may further include other logic circuits for its operation. The embodiment depicted in FIG. 3 is only for illustrative purpose, but does not limit the scope of the present invention.

Figure 4:
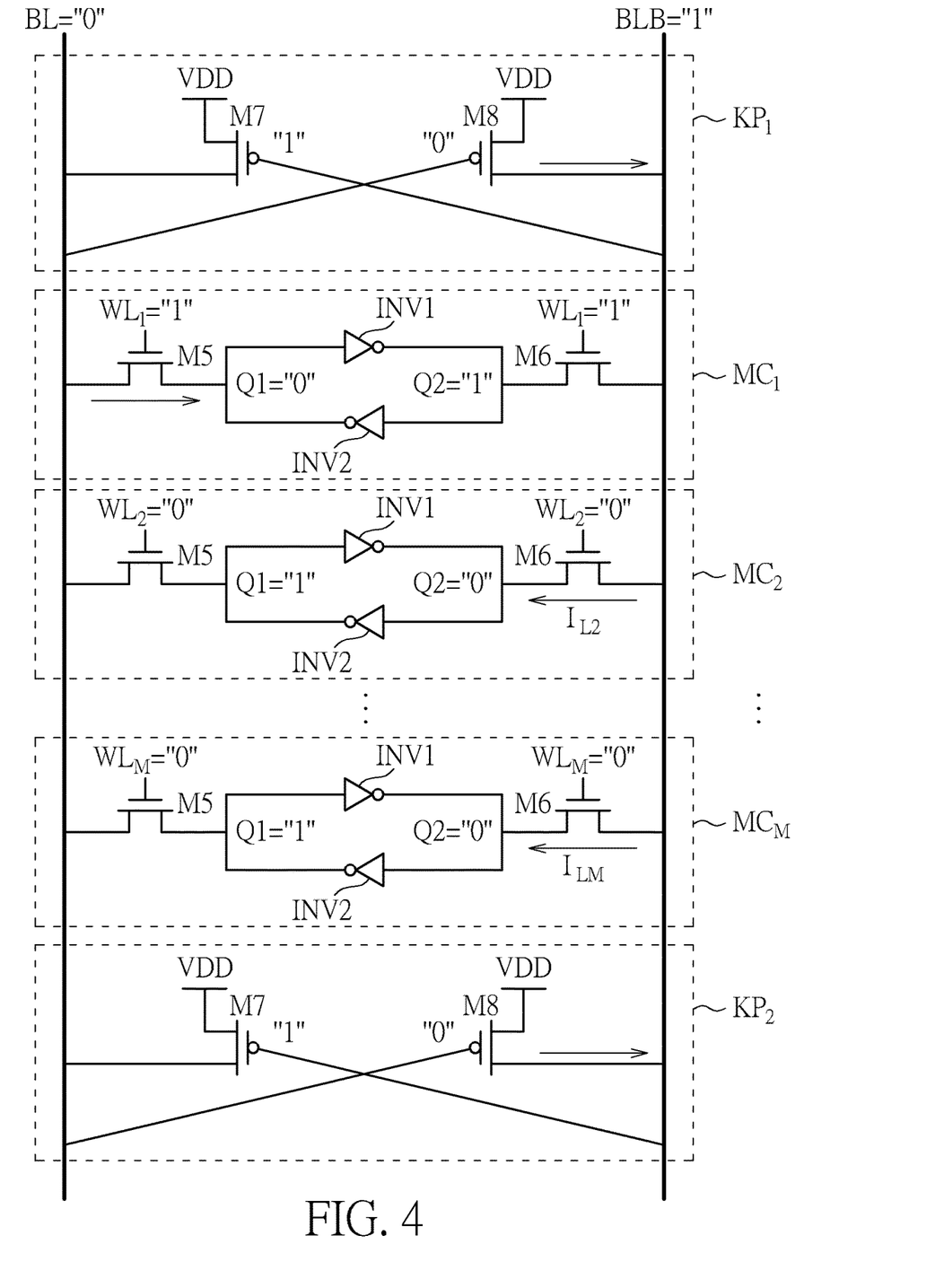
FIG. 4 is a diagram illustrating the active area in an SRAM device according to an embodiment of the present invention.

FIG. 4 is a diagram illustrating the active area in the SRAM device according to an embodiment of the present invention. For illustrative purpose, FIG. 4 only depicts the memory cells 10 coupled to two adjacent bit lines BL and BLB and the keeper circuits $KP_1$~$KP_2$. Each memory cell 10 maybe implemented by the 6T-SRAM structure shown in FIG. 1 and includes an inverter INV1, an inverter INV2, and two access transistors M5 and M6. For ease of explanation, the above-mentioned memory cells are designated as $MC_1$~$MC_M$ in FIG. 4.

Each keeper circuit includes transistors M7 and M8. The transistor M7 includes a first end coupled to a bias voltage VDD, a second end coupled to the bit line BL, and a control end coupled to the bit line BLB. The transistor M8 includes a first end coupled to the bias voltage VDD, a second end coupled to the bit line BLB, and a control end coupled to the bit line BL. When the bit line BL is at a logic 0 level and the bit line BLB is at a logic 1 level, the transistor M8 is turned on and the transistor M7 is turned off, which allows the bias voltage VDD to charge the bit line BLB via the transistor M8. When the bit line BL is at the logic 1 level and the bit line BLB is at the logic 0 level, the transistor M7 is turned on and the transistor M8 is turned off, which allows the bias voltage VDD to charge the bit line BL via the transistor M7. In an embodiment of the present invention, the transistors M7 and M8 may be implemented using P-type metal-oxide-semiconductors (PMOS). However, the type of the transistors M7 and M8 does not limit the scope of the present invention.

In the write operation, the word line decoding circuit WL-DEC is configured to translate input addresses and provide corresponding switching signals to the word lines $WL_1$~$WL_M$, thereby turning on the access transistors M5 and M6 in the corresponding memory cells 10. The bit lines BL and BLB are kept at respective constant levels, thereby forcing the storage nodes Q1 and Q2 in the memory cells 10 to change states. For writing in logic 0 data, the bit line BL is kept at VDD and the bit line BLB is kept at 0; for writing in logic 1 data, the bit line BL is kept at 0 and the bit line BLB is kept at VDD. In the read operation, both the bit lines BL and BLB are first pulled to a pre-charge level. Then the word line decoding circuit WL-DEC is configured to translate input addresses and provide corresponding switching signals to the word lines $WL_1$~$WL_M$, thereby turning on the access transistors M5 and M6 in the corresponding memory cells 10. Charge sharing and voltage-dividing may be achieve as the parasite capacitance of the storage nodes Q1 and Q2 influences the bit lines BL and BLB via the pull-down transistors PD1~PD2, thereby generating a voltage difference between the bit lines BL and BLB. The external sense amplifier is configured to amplify the voltage difference between the bit lines BL and BLB for a signal corresponding to logic 0 or logic 1 data to be read out.

In the embodiment illustrated in FIG. 4, for the same column of memory cells $MC_1$~$MC_M$ coupled to the bit line BL and the bit line BLB, it is assumed that a logic 1 data is stored in the first memory cell $MC_1$ controlled by the first word line $WL_1$ (with the storage node Q1 at logic 0 and the storage node Q2 at logic 1) and logic 0 data is stored in the second through $M^{th}$ memory cells $MC_2$~$MC_M$ respectively controlled by the second through $M^{th}$ word lines $WL_2$~$MC_M$ (with the storage node Q1 at logic 1 and the storage node Q2 at logic 0). When reading data from the first memory cell $MC_1$, its access transistors M5 and M6 are turned on by the first word line $WL_1$ at logic 1 level. Under such circumstance, the bit line BLB is pulled to logic 1 by its storage node Q2, and the bit line BL is pulled to logic 0 by its storage node Q1. Although the access transistors M5 and M6 in the second through $M^{th}$ memory cells $MC_2$~$MC_M$ are turned off by the second through $M^{th}$ word lines $WL_2$~$MC_M$ at logic 0 level, the logic 0 level of the storage nodes Q2 in the second through $M^{th}$ memory cells $MC_2$~$MC_M$ may pull down the level of the bit line BLB due to leakage current of their access transistors M5 and M6, as indicated by the current $I_{L2}$~$I_{LM}$.

In order to compensate the influence of the leakage current $I_{L2}$~$I_{LM}$ on the bit lines BL and BLB, when two adjacent word lines are respectively at logic 1 and logic 0, the keeper circuits of the present invention are configured to charge one of the bit line pair which is at logic 1. As depicted in FIG. 4, the transistor M7 in each keeper circuit is turned off by the bit line BLB at logic 1 and the transistor M8 in each keeper circuit is turned on by the bit line BL at logic 0, thereby allowing the bias voltage VDD to charge the bit line BLB via the transistor M8.

Figure 5:
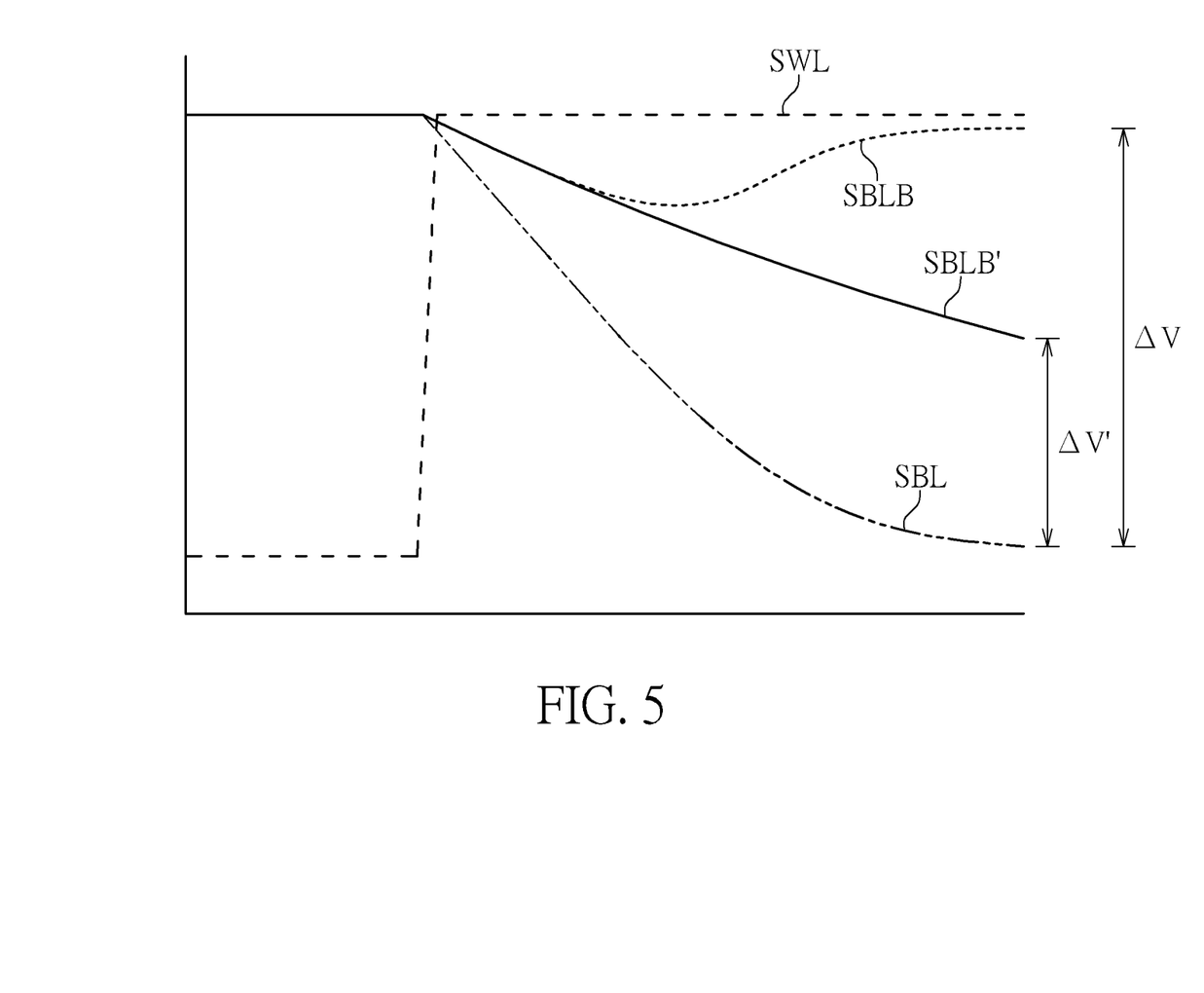
FIG. 5 is a diagram illustrating the waveforms associated with the operation of the keeper circuits in the SRAM device according to an embodiment of the present invention.

FIG. 5 is a diagram illustrating the waveforms associated with the operation of the keeper circuits in the SRAM device according to an embodiment of the present invention. SWL represents the waveform of the first word line $WL_1$, SBL represents the waveform of the bit line BL, SBLB represents the waveform of the bit line BLB, and SBLB' represents the waveform of the bit line BLB without implementing any keeper circuit. As depicted in FIG. 5, without implementing any keeper circuit, the voltage level of the bit line is pulled down by leakage current (waveform SBLB'), wherein the resulting voltage difference ΔV' is insufficient for the external sense amplifier SA to determine the correct data. In the present invention, the keeper circuits is able to compensate the influence of the leakage current and maintain the voltage level of the bit line BLB (waveform SBLB), wherein the resulting voltage difference ΔV is sufficient for the external sense amplifier SA to determine the correct data.

Figure 6:
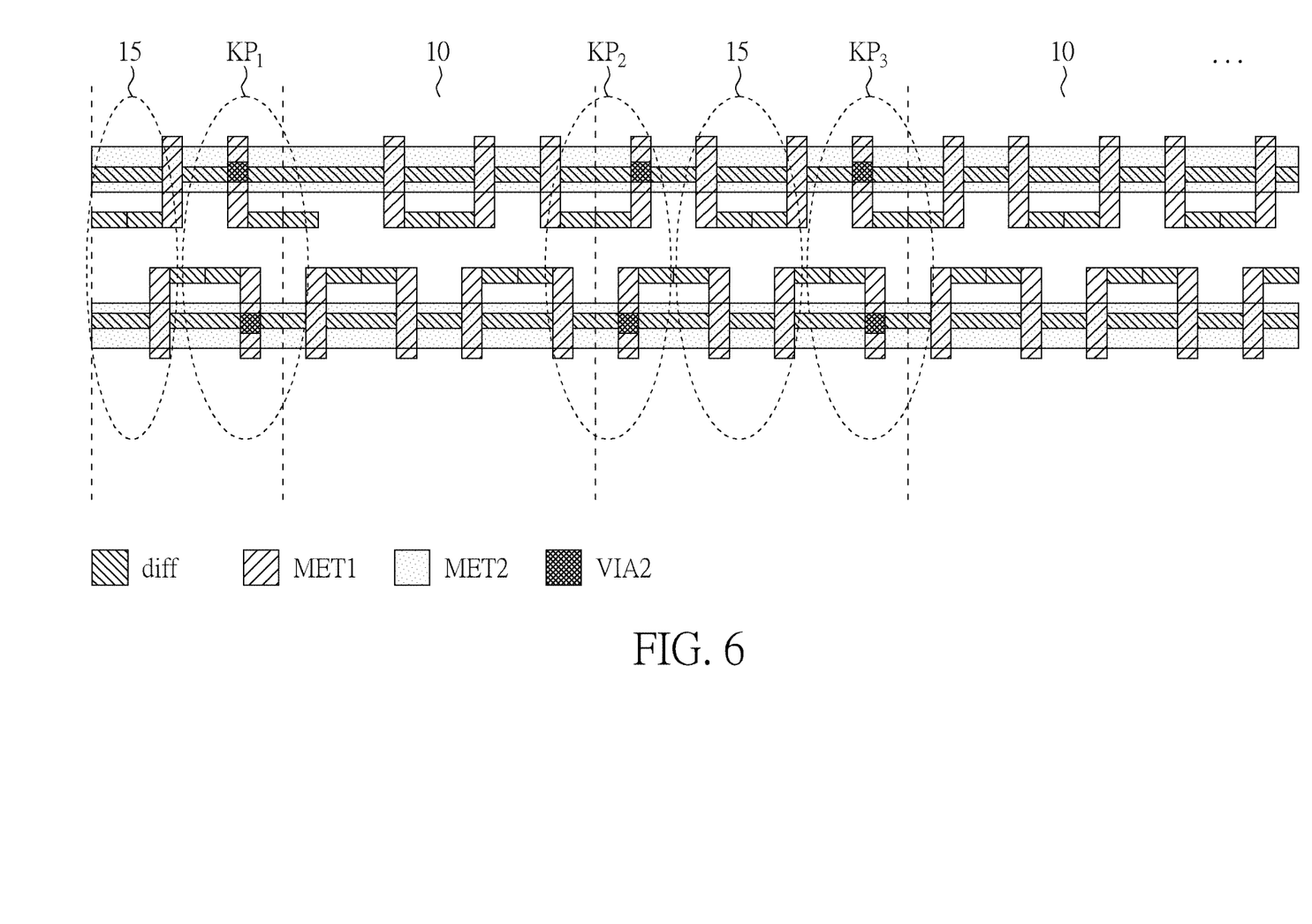
FIG. 6 is a diagram illustrating the layout of an SRAM device according to an embodiment of the present invention.

FIG. 6 is a diagram illustrating the layout of the SRAM device 100 or 200 according to an embodiment of the present invention. The area designated by stripes running from top-left to bottom-right represents the diffusion region diff. The area designated by stripes running from top-right to bottom-left represents the first metal layer MET1. The dotted area represents the second metal layer MET2. The grid area represents the vias VIA2.

In conclusion, the SRAM device according to the present invention adopts keeper circuits for compensating the influence of the leakage current on the bit lines, thereby increasing the accuracy of data readout. Meanwhile, the keeper circuits are disposed in the active area where the memory cells are formed instead of in the peripheral area where the logic circuit is formed. Therefore, the keeper circuits according to the present invention do not increase the circuit area overhead, design cost and complicity of the logic circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random-access memory (SRAM) device, comprising:
   a first memory cell formed in an active area and coupled to a first bit line and a second bit line;
   a second memory cell formed in the active area on the first side of the first memory cell, and coupled to the first bit line and the second bit line;
   a first keeper circuit formed in the active area on a first side of the first memory cell and configured to charge the second bit line when the first bit line is at a first voltage level and the second bit line is at a second voltage level higher than the first voltage level;
   a first word line coupled to the first memory cell and configured to control a signal path between the first bit line and the first memory cell and control a signal path between the second bit line and the first memory cell; and
   a second word line coupled to the second memory cell and configured to control a signal path between the first bit line and the second memory cell and control a signal path between the second bit line and the second memory cell, wherein the first keeper circuit is disposed in a gap region which is located between the first side of the first memory cell and a first side of the second memory cell.

2. The SRAM device of claim 1, wherein the first keeper circuit is further configured to charge the first bit line when the first bit line is at the second voltage level and the second bit line is at the first voltage level.

3. The SRAM device of claim 1, further comprising:
   a logic circuit, disposed outside the active area and located on the first side of the first memory cell, wherein the first keeper circuit is disposed in a first region of the active area which is between the first memory cell and the logic circuit.

4. The SRAM device of claim 3, further comprising:
   a strapping cell disposed in the first region of the active area.

5. The SRAM device of claim 3, wherein the first keeper circuit comprises:
   a first transistor, comprising:
      a first end coupled to the first bit line;
      a second end coupled to a first bias voltage; and
      a control end coupled to the second bit line; and
   a second transistor, comprising:
      a first end coupled to the second bit line;
      a second end coupled to a second bias voltage; and
      a control end coupled to the first bit line.

6. The SRAM device of claim 1, further comprising:
   a logic circuit, disposed outside the active area and located on a second side of the first memory cell, wherein the second side of the first memory cell is opposite to the first side of the first memory cell.

7. The SRAM device of claim 6, wherein the first keeper circuit comprises:
   a first transistor, comprising:
      a first end coupled to the first bit line;
      a second end coupled to a first bias voltage; and
      a control end coupled to the second bit line; and
   a second transistor, comprising:
      a first end coupled to the second bit line;
      a second end coupled to a second bias voltage; and
      a control end coupled to the first bit line.

8. The SRAM device of claim 1, further comprising:
   a logic circuit disposed on a second side of the second memory cell; and
   a second keeper circuit disposed in the active area and located in a first region of the active area which is between the first word line and the logic circuit.

9. The SRAM device of claim 8, further comprising:
a third keeper circuit disposed in a second region of the active area which is located on a second side of the second memory cell.

10. The SRAM device of claim 9, further comprising:
a strapping cell disposed in the first region, the second region or the gap region of the active area.

11. The SRAM device of claim 9, wherein each keeper circuit comprises:
a first transistor, comprising:
 a first end coupled to the first bit line;
 a second end coupled to a first bias voltage; and
 a control end coupled to the second bit line; and
a second transistor, comprising:
 a first end coupled to the second bit line;
 a second end coupled to a second bias voltage; and
 a control end coupled to the first bit line.

12. A static random-access memory (SRAM) device, comprising:
a plurality of bit line groups each including a first bit line and a second bit line disposed in parallel;
a first word line perpendicular to the first bit line and the second bit line of each bit line group;
a second word line parallel to the first word line;
a plurality of first memory cells respectively coupled to a corresponding bit line group among the plurality of bit line groups, and coupled to the first word line;
a plurality of second memory cells respectively coupled to a corresponding bit line group among the plurality of bit line groups, and coupled to the second word line;
a first keeper circuit and a first strapping cell disposed between the plurality of first memory cells and a logic circuit, and coupled to the first bit line and the second bit line of each bit line group;
a second keeper circuit and a second strapping cell disposed between the plurality of first memory cells and the plurality second memory cells; and
a third keeper circuit disposed between the plurality of first memory cells and the plurality second memory cells, wherein the second strapping cell is disposed between the second keeper circuit and the third keeper circuit.

* * * * *